(12) United States Patent
Bulja et al.

(10) Patent No.: US 10,033,080 B2
(45) Date of Patent: Jul. 24, 2018

(54) ELECTROCHROMIC CELL FOR RADIO-FREQUENCY APPLICATIONS

(71) Applicant: Alcatel-Lucent, Paris (FR)

(72) Inventors: Senad Bulja, Dublin (IE); Rose F. Kopf, Green Brook, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 555 days.

(21) Appl. No.: 14/272,190

(22) Filed: May 7, 2014

(65) Prior Publication Data
US 2015/0323576 A1 Nov. 12, 2015

(51) Int. Cl.
| | | |
|---|---|---|
| H01P 5/02 | (2006.01) |
| G01R 27/06 | (2006.01) |
| H01P 3/00 | (2006.01) |
| G01R 27/28 | (2006.01) |
| G01R 27/26 | (2006.01) |

(52) U.S. Cl.
CPC .............. *H01P 5/028* (2013.01); *G01R 27/06* (2013.01); *G01R 27/2617* (2013.01); *G01R 27/28* (2013.01); *H01P 3/006* (2013.01)

(58) Field of Classification Search
CPC ... G01R 31/2822; G01N 22/00; A61B 5/0507
USPC ......................................................... 324/638
See application file for complete search history.

(56) References Cited

U.S. PATENT DOCUMENTS

| | | | |
|---|---|---|---|
| 6,646,522 B1 | 11/2003 | Kozyrev et al. |
| 7,876,143 B2 | 1/2011 | Sasaki |
| 7,973,618 B2 | 7/2011 | Nam et al. |
| 8,008,836 B2 | 8/2011 | Du et al. |
| 8,427,254 B2 | 4/2013 | Shinohara et al. |
| 8,456,255 B2 | 6/2013 | Iluz |
| 8,610,477 B2 | 12/2013 | Koechlin et al. |

(Continued)

FOREIGN PATENT DOCUMENTS

EP    0358497 A2    3/1990

OTHER PUBLICATIONS

Di Paolo, Franco, Ph.D., "Coplanar Waveguides," Networks and Devices Using Planar Transmissions Lines, Chapter 10, Boca Raton: CRC Press LLC, 2000 (32 pages).

(Continued)

*Primary Examiner* — Arleen M Vazquez
*Assistant Examiner* — Akm Zakaria
(74) *Attorney, Agent, or Firm* — Mendelsohn Dunleavy, P.C.; Yuri Gruzdkov (57) ABSTRACT

A disclosed electrical cell enables experimental measurements of dielectric properties of an electrochromic material in the radio-frequency range of the electromagnetic spectrum. In an example embodiment, the electrical cell includes a layer of the electrochromic material under test that is sandwiched between a conducting base plane and a microstrip line. The conducting base plane and the microstrip line are electrically connected to a co-planar waveguide configured for application of superimposed DC-bias and RF-probe signals using a conventional probe station and a vector network analyzer. The S-parameters of the electrical cell measured in this manner can then be used, e.g., to obtain the complex dielectric constant of the electrochromic material under test as a function of frequency.

19 Claims, 8 Drawing Sheets

(56) References Cited

U.S. PATENT DOCUMENTS

| | | | |
|---|---|---|---|
| 8,614,848 B2 | 12/2013 | Ueda et al. | |
| 2003/0072549 A1* | 4/2003 | Facer | G01N 22/00 |
| | | | 385/129 |
| 2003/0227664 A1* | 12/2003 | Agrawal | G02F 1/1523 |
| | | | 359/269 |
| 2008/0204850 A1 | 8/2008 | Agrawal et al. | |
| 2010/0066389 A1* | 3/2010 | Subramanyam | G01N 27/221 |
| | | | 324/658 |
| 2010/0079222 A1* | 4/2010 | Makita | H01L 23/66 |
| | | | 333/238 |
| 2010/0182105 A1* | 7/2010 | Hein | H01P 3/003 |
| | | | 333/239 |
| 2010/0258745 A1 | 10/2010 | Wisnudel et al. | |
| 2013/0106456 A1* | 5/2013 | Weikle, II | G01R 1/06744 |
| | | | 324/754.06 |

OTHER PUBLICATIONS

"Theoretical Characterization of Coplanar Waveguide Transmission Lines and Discontinuities," www.eecs.umich.edu, 1992 [retrieved on Jan. 24, 2014]. Retrieved from the Internet: <URL: http://http://www.eecs.umich.edu/RADLAB/html/techreports/RL886.pdf.> (218 pages).

Costanzo, S., "Synthesis of Multi-Step Coplanar Waveguide-to-Microstrip Transition," Progress in Electromagnetics Research, vol. 113, 111-126, 2011, (16 pages).

Coonrod, John, et al., "Comparing Microstrip and CPW Performance," European Microwave Integrated Circuits Conference (EuMIC), Jul. 2011, vol. 55, No. 7, pp. 74-82.

Kyabaggu, Peter B. K., et al., "Wideband 3D Coplanar Waveguide to Thin-Film Microstrip Transition in Multilayer Technology," Proceedings of the 6th European Microwave Integrated Circuits Conference, 2011, pp. 604-607.

"Coplanar-Microstrip Transitions for Ultra-Wideband Communications," www.intechopen.com, 2011 [retrieved on Jan. 24, 2014]. Retrieved from the Internet: <URL: http://www.intechopen.com/download/pdf/17811> (23 pages).

Xuping, Zhang et al., "An All-Solid-State Inorganic Electrochromic Display of WO3 and NiO Films with LiNbO3 Ion Conductor," IEEE Electron Device Letters, vol. 21, No. 5, May 2000, pp. 215-217.

Pucel, Robert A. et al., "Losses in Microstrip," IEEE Transactions on Microwave Theory and Techniques, vol. MTT-16, No. 6, Jun. 1968, pp. 342-350.

Bulja, Senad et al., "Novel Wideband Transition Between Coplanar Waveguide and Microstrip Line," IEEE Transactions on Microwave Theory and Techniques, vol. 58, No. 7, Jul. 2010, pp. 1851-1857.

Reed, J. et al., "A Method of Analysis of Symmetrical Four—Port Networks," IRE Transactions on Microwave Theory and Techniques, 1956, vol. 4, No. 4, pp. 246-252.

Vergaz, Ricardo et al., "Electrical Analysis of New All-Plastic Electrochromic Devices," Optical Engineering, 2006, vol. 45, No. 11 (9 pages).

Vergaz, Ricardo et al., "Electrical Characterization of New Electrochromic Devices," Spanish Conference on Electron Devices, 2007, pp. 150-153.

Lee, Se-Hee Lee, et al., "Electrochromic Mechanism in a-WO3²y Thin Films," Applied Physics Letters vol. 74, No. 2, Jan. 11, 1999, pp. 242-244.

Argun, Avni A., et al., "Multicolored Electrochromism in Polymers: Structures and Devices," Published in Chemistry Materials, 2004, vol. 16, pp. 4401-4412.

* cited by examiner

TABLE: PARAMETERS OF STRUCTURE 208

| LAYER | EMBODIMENT A | | EMBODIMENT B | | EMBODIMENT C | |
|---|---|---|---|---|---|---|
| | MATERIAL | THICKNESS (nm) | MATERIAL | THICKNESS (nm) | MATERIAL | THICKNESS (nm) |
| 302 | Ti | 0 | Ti | 10 | Ti | 10 |
| 240 | $WO_3$ | 150 | $WO_3$ | 150 | $WO_3$ | 150 |
| 238 | $LiNbO_3$ | 450 | $LiNbO_3$ | 450 | $LiNbO_3$ | 600 |
| 236 | NiO | 110 | NiO | 110 | NiO | 120 |

ELECTROCHROMIC CELL FOR RADIO-FREQUENCY APPLICATIONS

CROSS-REFERENCE TO RELATED APPLICATIONS

The subject matter of this application is related to that of U.S. Patent Application Publication No. 2015/0325897, which is incorporated herein by reference in its entirety.

BACKGROUND

Field

The present disclosure relates to electrical circuits and, more specifically but not exclusively, to an electrochromic cell for radio-frequency applications.

Description of the Related Art

This section introduces aspects that may help facilitate a better understanding of the disclosure. Accordingly, the statements of this section are to be read in this light and are not to be understood as admissions about what is in the prior art or what is not in the prior art.

An electrochromic (EC) material is broadly defined as a material whose optical characteristics can be reversibly changed by an application of an external voltage or a light source. Representative examples of EC materials include but are not limited to (i) transition-metal and inorganic oxides, such as tungsten oxide; (ii) small organic molecules, such as viologens; and (iii) polymers, such as poly-viologens and derivatives of poly-thiophene, polypyrrole, and polyaniline. Some EC materials may be used in electronic displays, smart windows, eyewear, optical shutters, rearview visors, and hydrogen sensors.

SUMMARY OF SOME SPECIFIC EMBODIMENTS

Disclosed herein are various embodiments of an electrical cell for experimental measurements of dielectric properties of an electrochromic material in the radio-frequency range of the electromagnetic spectrum. In an example embodiment, the electrical cell includes a layer of the electrochromic material under test that is sandwiched between a conducting base plane and a microstrip line. The conducting base plane and the microstrip line are electrically connected to a co-planar waveguide configured for application of superimposed DC-bias and RF-probe signals using a conventional probe station and a vector network analyzer. The S-parameters of the electrical cell measured in this manner can then be used, e.g., to obtain the complex dielectric constant of the electrochromic material under test as a function of frequency.

According to one embodiment, provided is an apparatus comprising: a first coplanar waveguide that comprises a first center-conductor strip, a first side-conductor strip, and a second side-conductor strip formed on a surface of a substrate; a multilayered structure that comprises a base layer formed on the surface of the substrate and connected to the first and second side-conductor strips, and a layer of a first electrochromic material formed on the base layer; a microstrip line formed on a surface of the multilayered structure at a first offset distance from the base layer; and a first transition structure configured to electrically connect the first center-conductor strip and the microstrip line.

According to another embodiment, provided is a method of measuring dielectric properties of an electrochromic material, the method comprising the steps of: (A) measuring S-parameters of an electrical cell, wherein the electrical cell comprises: a first coplanar waveguide that comprises a first center-conductor strip, a first side-conductor strip, and a second side-conductor strip formed on a surface of a substrate; a multilayered structure that comprises a base layer formed on the surface of the substrate and connected to the first and second side-conductor strips, and a layer of the electrochromic material formed on the base layer; a microstrip line formed on a surface of the multilayered structure and located at a first offset distance from the base layer; and a first transition structure configured to electrically connect the first center-conductor strip and the microstrip line; and (B) calculating a complex dielectric constant of the electrochromic material based on the measured S-parameters of the electrical cell.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Figure 1:
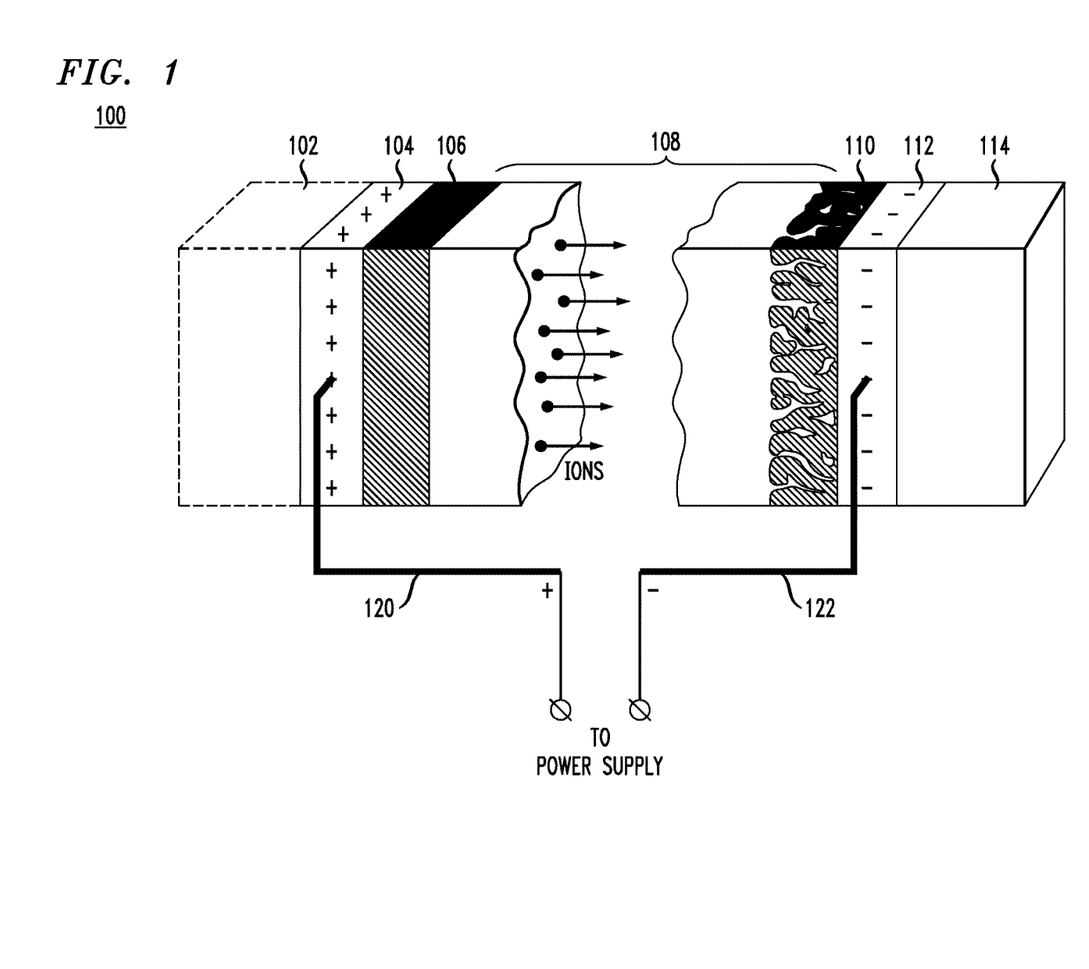
FIG. 1 schematically shows a multilayered structure having an electrochromic (EC) material according to an embodiment of the disclosure.

FIG. 1 shows a schematic view of a multilayered structure 100 having an electrochromic (EC) material according to an embodiment of the disclosure. Structure 100 has a substrate 114 on which the other layers of the structure may be formed during the fabrication process. In one embodiment, substrate 114 is a glass or semiconductor layer. In some embodiments, substrate 114 may itself be a multilayered structure. In some embodiments, substrate 114 may include a polymer, such as polyethylene terephthalate.

Structure 100 further includes two electrode layers, 104 and 112, configured to be electrically connected to a power supply via electrical leads 120 and 122, e.g., as indicated in FIG. 1. Layer 112 is made of an electrically conducting material (e.g., a metal or metallic alloy) and is configured as a cathode. Layer 104 is also made of an electrically conducting material and is configured as an anode. The electrically conducting material of layer 112 may be the same as or different from the electrically conducting material of layer 104. In some embodiments, one or both of electrode layers 104 and 112 may be omitted from the structure. If electrode layer 104 is omitted, then electrical lead 120 may be directly electrically connected to an ion-storage layer 106. If electrode layer 112 is omitted, then electrical lead 122 may be directly electrically connected to an EC layer 110. In some embodiments, one or both of electrode layers 104 and 112 may be made of indium tin oxide or some other transparent electrically conducting material.

EC layer 110 may comprise any suitable EC material, such as $WO_3$, $TiO_2$, $MoO_3$, $Ta_2O_5$, $Nb_2O_5$, or any of the above-mentioned or other suitable EC materials. It may be beneficial when EC layer 110 has good electrical conductivity. In different embodiments, ion-storage layer 106 may or may not be present. When structure 100 has ion-storage layer 106, it may be beneficial to make that layer of an EC material that exhibits electrochromic characteristics complimentary to those of EC layer 110. Some example materials that can be used for ion-storage layer 106 are NiO, $Cr_2O_3$, $MnO_2$, $FeO_2$, $CoO_2$, $RhO_2$, and $IrO_2$.

An ion-conductor (solid electrolyte) layer 108 serves as a reservoir of ions for injection into EC layer 110. Ion-conductor layer 108 may also receive and/or inject ions from/into ion-storage layer 106. It may be beneficial to make ion-conductor layer 108 from a material that has different conductivities for ions and electrons.

An optional outer layer 102 may be deposited over electrode layer 104 to encapsulate the other layers of structure 100, e.g., for protection and/or structural integrity. In an example embodiment, outer layer 102 can be made of glass or polymer.

When voltage is applied to electrical leads 120 and 122, a corresponding electric field is generated between electrode layers 104 and 112. This electric field causes ions to be introduced into EC layer 110 from ion-conductor layer 108. The electrical charge caused by this injection of ions into EC layer 110 is neutralized by a corresponding charge-balancing counter flow of electrons from electrode layer 112. This injection of ions and electrons into EC layer 110 causes a persistent change of its optical properties, such as color, due to electrochromism.

As an illustration, for an embodiment, wherein EC layer 110 comprises tungsten oxide, $WO_3$, the relevant electrochemical processes therein are believed to be described by the following simplified redox reaction:

$$xM^+ + xe^- + a\text{-}WO_{3-y} \longleftrightarrow a\text{-}M_xWO_{3-y} \quad (1)$$

where M can be H, Li, etc.; and a, x, and y are stoichiometric coefficients. a-$WO_{3-y}$ is typically colorless, while a-$M_xWO_{3-y}$ is typically blue. When ion-storage layer 106 comprises polyaniline, the relevant electrochemical processes therein are believed to be described by the following simplified redox reaction:

$$p\text{-}An + xA^- - xe^- \longleftrightarrow (p\text{-}An)A_x \quad (2)$$

where p-An is polyaniline; and $A^-$ is a counter-anion. p-An is typically pale yellow, while (p-An)$A_x$ may be green or blue.

Reaction (1) indicates that the color change in EC layer 110 occurs upon ion and electron intercalation from layers 108 and 112, respectively. Reaction (2) similarly indicates that the color change in ion-storage layer 106 occurs upon ion intercalation from ion-conductor layer 108 and electron de-intercalation into electrode layer 104. Both EC layers (i.e., ion-storage layer 106 and EC layer 110) in structure 100 may exhibit an open-circuit memory, meaning that, once a certain state, colored or bleached, is attained via the application of the corresponding dc bias voltage to electrical leads 120 and 122, the dc bias voltage can be switched OFF, with the attained state of the EC layers persisting for a prolonged period of time. The lifetime of the open-circuit memory in structure 100 may depend relatively strongly on the types of EC materials used in layers 106 and 110, the type of solid electrolyte used in ion-conductor layer 108, and the resistive load connected to electrical leads 120 and 122.

Conventional applications of EC materials mostly utilize and rely on the changes in the characteristics of EC materials in the visible range of the electromagnetic spectrum, e.g., as detailed in the review article by Avni A. Argun, Pierre-Henri Aubert, Barry C. Thompson, et al., entitled "Multicolored Electrochromism in Polymers: Structures and Devices," published in Chem. Mater., 2004, v. 16, pp. 4401-4412, which is incorporated herein by reference in its entirety. In contrast, we have realized that the changes in the characteristics of an EC material in the visible range of the electromagnetic spectrum may also be indicative of relatively strong concurrent changes in the characteristics of the EC material in the radio-frequency (RF) or microwave range of the electromagnetic spectrum. If this is indeed the case, then the latter changes can be exploited to create novel voltage-controlled, tunable circuit elements for a wide range of RF or microwave applications. However, technical means for performing the relevant quantitative measurements on EC materials, testing them, and providing materials specifications to RF-circuit engineers are not sufficiently developed yet. Various embodiments described below at least partially address this problem.

Figure 2A:
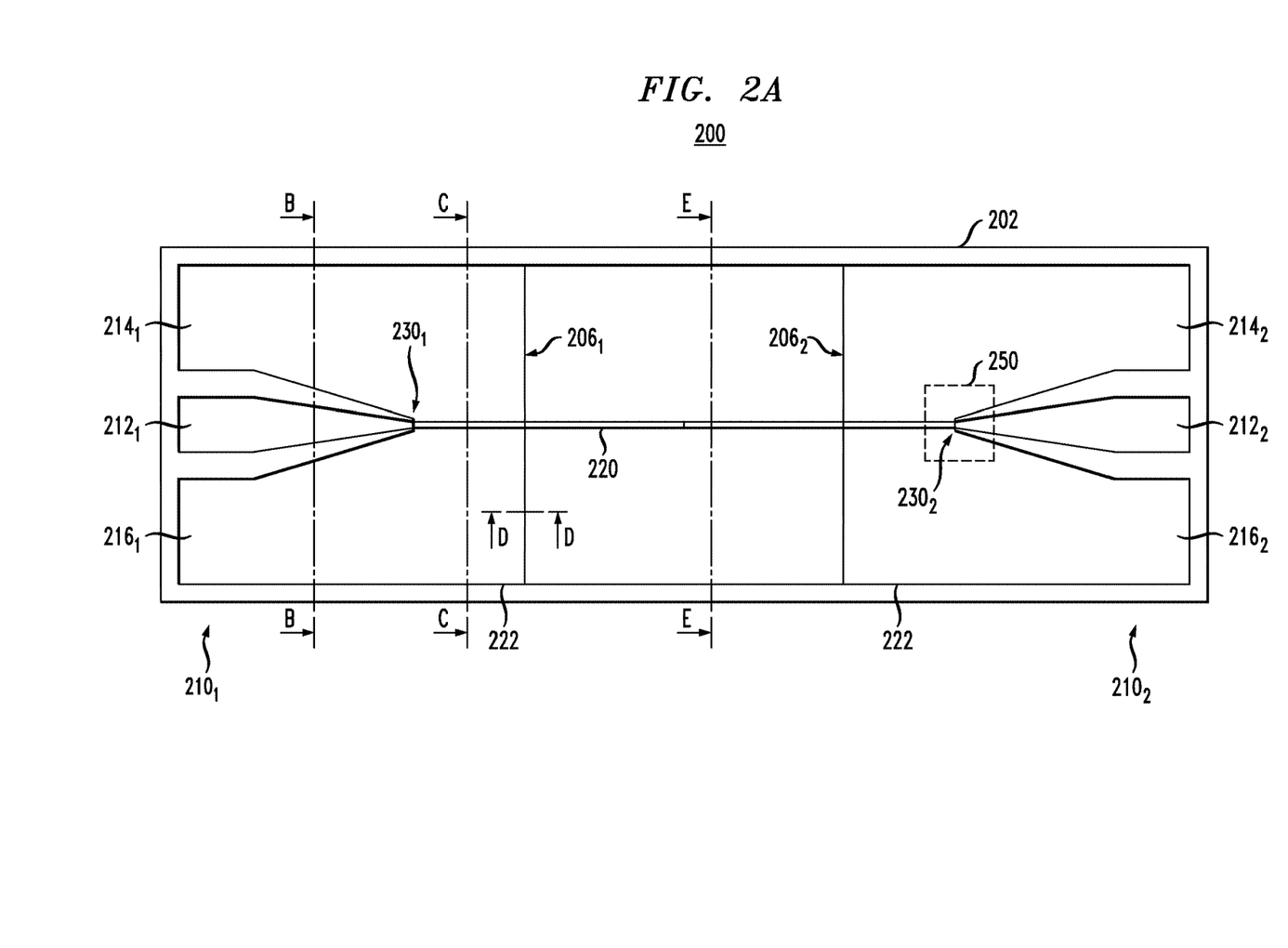
FIGS. 2A-2F show various schematic views of an electrical cell that can be used to characterize an EC material in the RF range of the electromagnetic spectrum according to an embodiment of the disclosure.
Figure 2B:
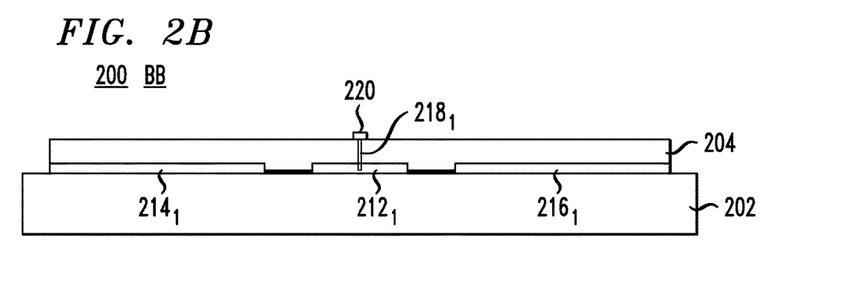
Figure 2C:
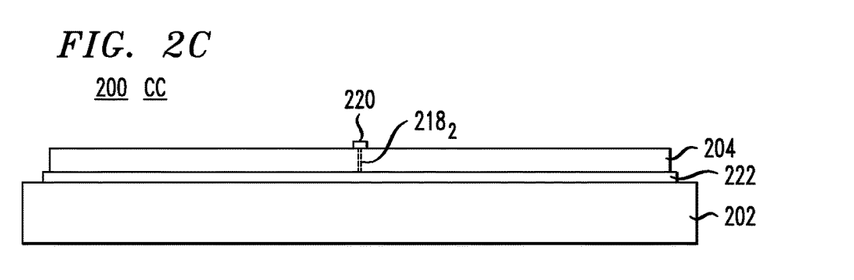
Figure 2D:
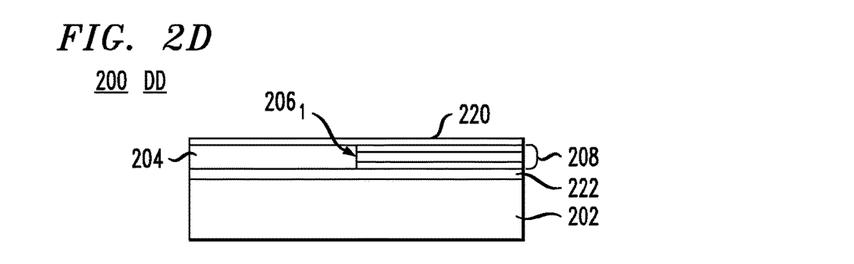
Figure 2E:
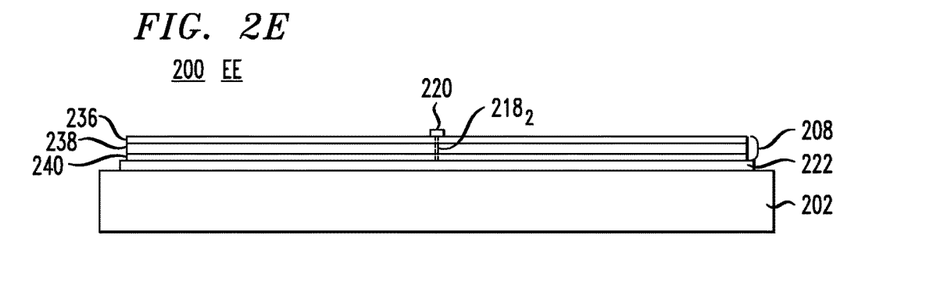
Figure 2F:
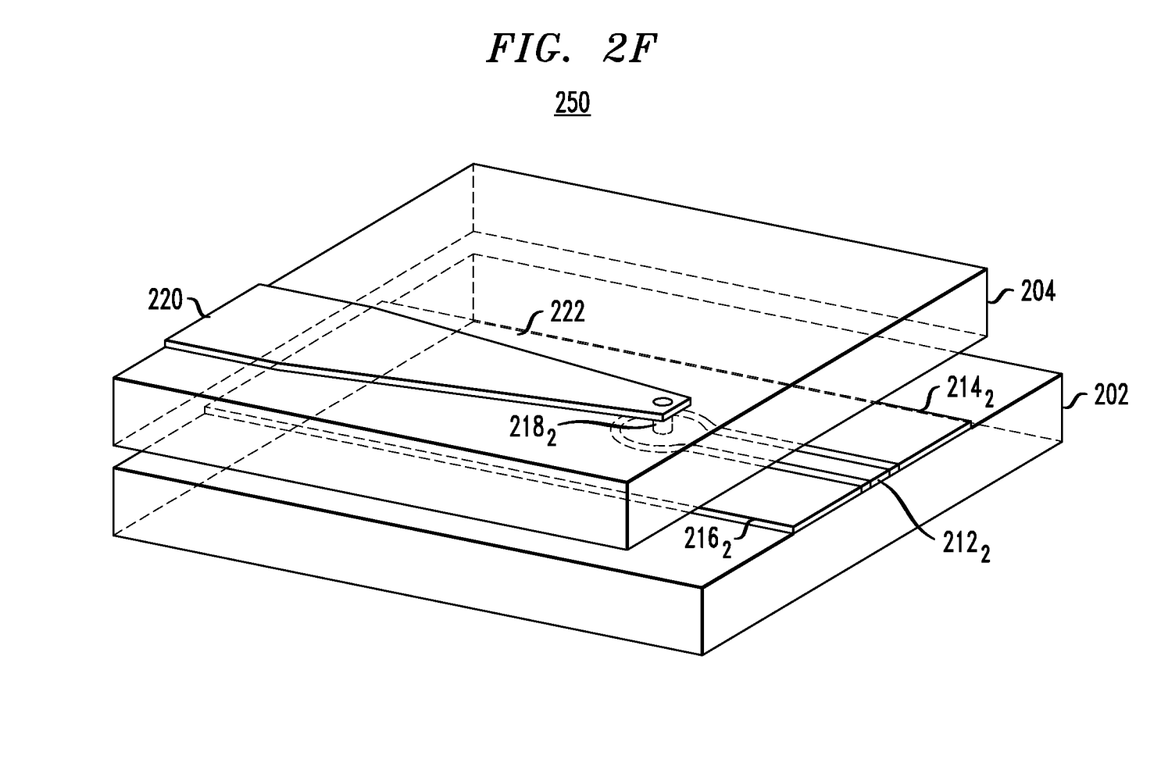

FIGS. 2A-2F show various schematic views of an electrical cell 200 that can be used to characterize an EC material in the RF range of the electromagnetic spectrum according to an embodiment of the disclosure. More specifically, FIG. 2A shows (not to scale) a top view of cell 200. FIGS. 2B-2E show (not to scale) cross-sectional side views of cell 200 along cross-section planes BB, CC, DD, and EE, respectively, shown in FIG. 2A. FIG. 2F shows (not to scale) a deconstructed, semi-transparent three-dimensional view of an area 250 in cell 200 (also see FIG. 2A).

Cell 200 has two coplanar waveguides (CPWs) $210_1$ and $210_2$ formed on a surface of a substrate 202. Coplanar waveguide $210_1$ comprises a center-conductor strip $212_1$ flanked by side-conductor strips $214_1$ and $216_1$. Coplanar waveguide $210_2$ similarly comprises a center-conductor strip $212_2$ and side-conductor strips $214_2$ and $216_2$. Coplanar waveguide $210_1$ is connected to a microstrip line 220 at one end thereof via a CPW-to-microstrip transition $230_1$. Coplanar waveguide $210_2$ is similarly connected to microstrip line 220 at the other end thereof via a CPW-to-microstrip transition $230_2$.

In an example embodiment, CPW-to-microstrip transitions $230_1$ and $230_2$ have similar structures. As an illustration, FIG. 2F shows CPW-to-microstrip transition $230_2$ in more detail. As indicated in FIG. 2F, center-conductor strip $212_2$ and side-conductor strips $214_2$ and $216_2$ are in a plane located between substrate 202 and a dielectric layer 204. The end of microstrip line 220 overhangs the end of center-conductor strip $212_2$ in area 250, and the two ends are vertically offset and separated from one another by dielectric layer 204, e.g., as indicated in FIG. 2F. An electrically conducting via $218_2$ formed in the portion of dielectric layer 204 between the ends of microstrip line 220 and center-conductor strip $212_2$ electrically connects the two. A similar electrically conducting via $218_1$ electrically connects center-conductor strip $212_1$ and microstrip line 220 in CPW-to-microstrip transition $230_1$ (e.g., see FIG. 2B). In the portion of cell 200 located between electrically conducting vias $218_1$ and $218_2$, side-conductor strips $214_1$, $216_1$, $214_2$, and $216_2$ merge together into an electrically conducting base plane 222 as indicated in FIG. 2F. Base plane 222 is also marked in each of FIGS. 2A and 2C-2E.

CPW-to-microstrip transitions $230_1$ and $230_2$ may be designed to have relatively low RF-power reflections. This characteristic may be attained by designing CPW-to-microstrip transitions $230_1$ and $230_2$ in a manner that causes these transitions not to function as impedance transformers, e.g., by matching the impedance of the connected CPW and microstrip-line sections to a selected constant value, such as 50 Ohm. Additional technical details that may be useful in the design of CPW-to-microstrip transitions $230_1$ and $230_2$ can be found in the article by Senad Bulja and Dariush Mirshekar-Syahkal, entitled "Novel Wideband Transition Between Coplanar Waveguide and Microstrip Line," published in IEEE TRANSACTIONS ON MICROWAVE THEORY AND TECHNIQUES, July 2010, vol. 58, No. 7, pp. 1851-1857, which is incorporated herein by reference in its entirety. In alternative embodiments, CPW-to-microstrip transitions $230_1$ and $230_2$ may benefit from the CPW-to-microstrip transition structures disclosed in European Patent Application Publication No. EP 0358497 A2 and the paper by Peter B. K. Kyabaggu, Emerson Sinulingga, Mayahsa M. Ali, et al., entitled "Wideband 3D Coplanar Waveguide to Thin-Film Microstrip Transition in Multilayer Technology," published in the Proceedings of the 6th European Microwave Integrated Circuits Conference, 10-11 Oct. 2011, pp. 604-607, Manchester, UK, both of which are incorporated herein by reference in their entirety.

Dielectric layer 204 has two parts, one located in the portion of cell 200 corresponding to coplanar waveguide $210_1$ and CPW-to-microstrip transition $230_1$, and the other located in the portion of the cell corresponding to coplanar waveguide $210_2$ and CPW-to-microstrip transition $230_2$. The two parts of dielectric layer 204 are laterally separated by a multilayered structure 208 (see FIGS. 2D-2E). Junctions $206_1$ and $206_2$ between multilayered structure 208 and the two parts of dielectric layer 204 are also marked in FIG. 2A. A cross-sectional view of junction $206_1$ is shown in FIG. 2D. As can be seen in FIG. 2D, multilayered structure 208 has substantially the same thickness as dielectric layer 204 to enable microstrip line 220 to be flat and straight.

In an example embodiment, multilayered structure 208 comprises three layers, labeled 236, 238, and 240, respectively (see FIG. 2E). Layers 236, 238, and 240 of multilayered structure 208 are functionally analogous to ion-storage layer 106, ion-conductor layer 108, and EC layer 110, respectively, of multilayered structure 100 (FIG. 1). In alternative embodiments, multilayered structure 208 may have more or fewer than three layers, e.g., as explained above in reference to multilayered structure 100. For example, in one alternative embodiment, multilayered structure 208 may have one or two additional layers (not explicitly shown in FIGS. 2D-2E), e.g., functionally analogous to electrode layers 104 and 112 shown in FIG. 1. As another example, an embodiment of multilayered structure 208 may not have layers analogous to the layers that have been indicated as "optional" in the above description of multilayered structure 100 (FIG. 1).

In general, base plane 222 can be configured to function as a first electrode layer for multilayered structure 208 (e.g., analogous to electrode layer 112 in multilayered structure 100). Microstrip line 220 can similarly be configured to function as a second electrode layer for multilayered structure 208 (e.g., analogous to electrode layer 104 in multilayered structure 100). The width of microstrip line 220 may be selected to be much greater (e.g., by a factor of about 100 or more) than the thickness of multilayered structure 208 to reduce (e.g., to a negligible level) the contribution of the fringe electrical fields generated at the edges of the microstrip line into the measured characteristics of the EC material(s) obtained with cell 200, e.g., as described below in reference to FIGS. 5-6.

Figure 3:
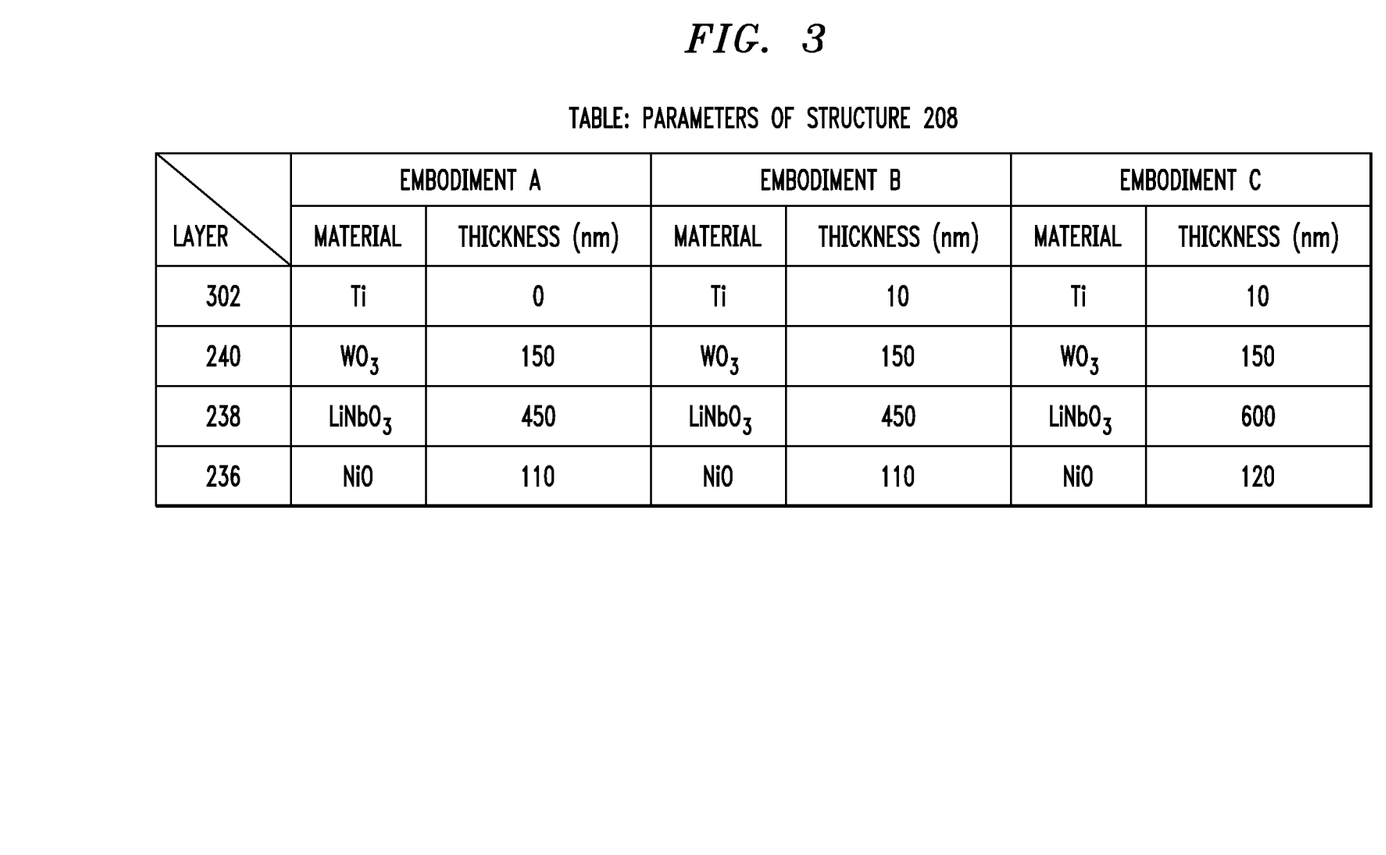
FIG. 3 shows a table that lists several example parameters of a multilayered structure used in the electrical cell of FIG. 2 according to example embodiments of the disclosure.

FIG. 3 shows a table that lists some example parameters of multilayered structure 208 according to example embodiments of the disclosure. The table lists the different layers in the order they are deposited over base plane 222 (also see FIG. 2E). For example, in Embodiment B, a titanium layer 302 (not explicitly shown in FIGS. 2D-2E) is deposited first, and NiO layer 236 is deposited last. As a comparison of Embodiments A and B indicates, titanium layer 302 is optional. One of its useful functions is to improve the adhesion between base plane 222 and EC layer 240. When titanium layer 302 is present, it may be considered as a sub-layer of the electrode layer corresponding to electrode layer 112 in structure 100 (FIG. 1). In the shown embodiments, the total thickness of multilayered structure 208 is about 750 nm. In an alternative embodiment, multilayered structure 208 may have a different suitable total thickness. One of ordinary skill in the art will readily understand how to appropriately partition said total thickness between the different constituent layers of multilayered structure 208. The use of alternative chemical compositions and materials, other than those listed in the table of FIG. 3, is also contemplated. One of ordinary skill in the art will appreciate that, in alternative embodiments, the listed thickness values may be changed and other suitable materials may be used instead of the listed materials without departing from the disclosed principles of the invention(s) claimed herein.

FIGS. 4A-4E show a process flow that can be used to fabricate electrical cell 200 (FIG. 2) according to an embodiment of the disclosure. More specifically, each of FIGS. 4A-4E shows a simplified cross-sectional side view of cell 200 at a respective stage of the manufacturing process. The thickness of the nascent structures of cell 200 is shown in the figures not to scale, and the top views (not explicitly shown in FIGS. 4A-4E) generally correspond to those shown in FIGS. 2A and 2F.

Figure 4A:
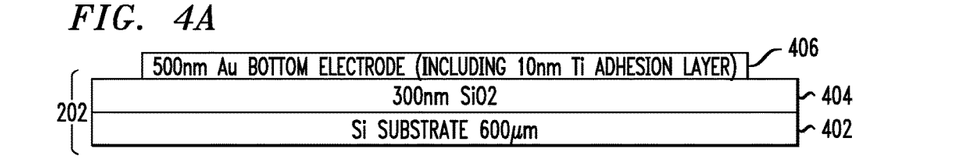
FIGS. 4A-4E show a process flow that can be used to fabricate the electrical cell of FIG. 2 according to an embodiment of the disclosure.

Referring to FIG. 4A, the fabrication process of cell 200 begins with substrate 202. In an example embodiment, substrate 202 comprises a relatively thick semiconductor (e.g., Si) layer 402 and a relatively thin dielectric (e.g., $SiO_2$) layer 404. Dielectric layer 404 may be formed by oxidizing layer 402 or by being deposited over it, e.g., as known in the art. A metal (e.g., Au/Ti) layer 406 is then deposited over dielectric layer 404. Metal layer 406 is then patterned and etched to form coplanar waveguides $210_1$ and $210_2$ and base plane 222 (see FIG. 2).

Figure 4B:
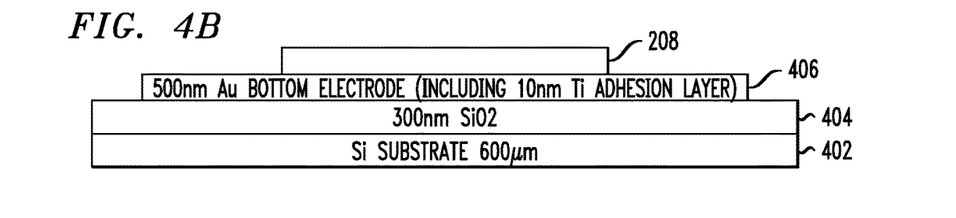

Referring to FIG. 4B, multilayered structure 208 is formed over the portion of metal layer 406 corresponding to base plane 222 by successively depositing the various layers of the multilayered structure, e.g., as indicated in FIG. 3. For clarity of depiction, the constituent layers of multilayered structure 208 are not explicitly shown in FIG. 4B (and also in FIGS. 4C-4E).

Figure 4C:
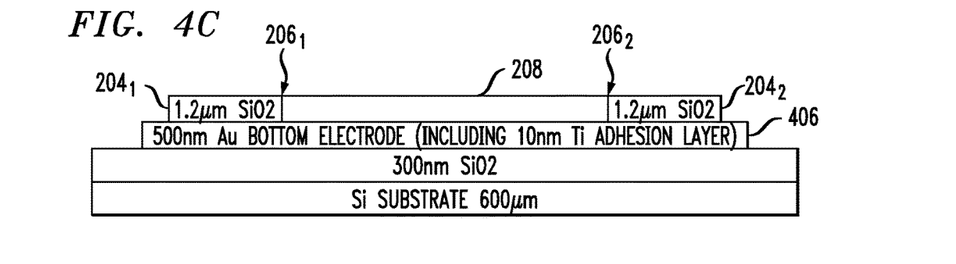

Referring to FIG. 4C, parts $204_1$ and $204_2$ of dielectric layer 204 are formed on the patterned and etched metal layer 406 at the sides of multilayered structure 208 as indicated in the figure. The side edges of multilayered structure 208 become parts of junctions $206_1$ and $206_2$ between multilayered structure 208 and the formed dielectric layer 204.

Figure 4D:
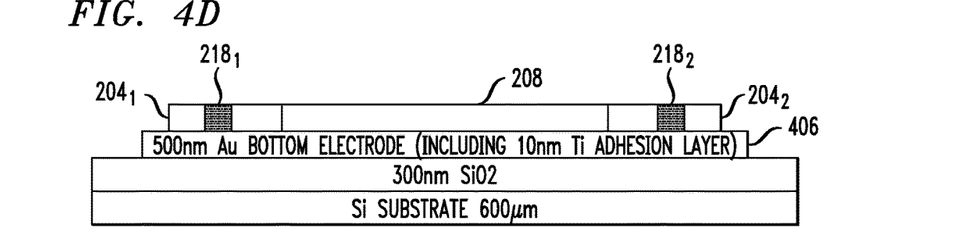

Referring to FIG. 4D, two holes protruding down to metal layer 406 are etched in parts $204_1$ and $204_2$ of dielectric layer 204 as indicated in the figure. The holes are then filled up with an electrically conducting material (e.g., metal) to form electrically conducting vias $218_1$ and $218_2$, respectively.

Figure 4E:
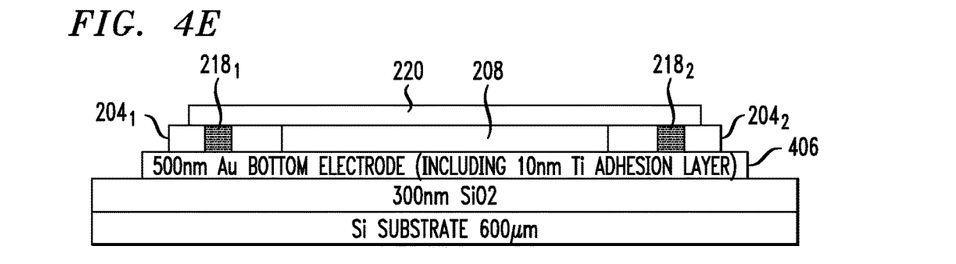

Referring to FIG. 4E, microstrip line 220 is formed over multilayered structure 208 and parts $204_1$ and $204_2$ of dielectric layer 204 to electrically connect vias $218_1$ and $218_2$ to one another. The resulting structure may then be further processed and packaged, as known in the art, to form the final structure of cell 200.

Figure 5:
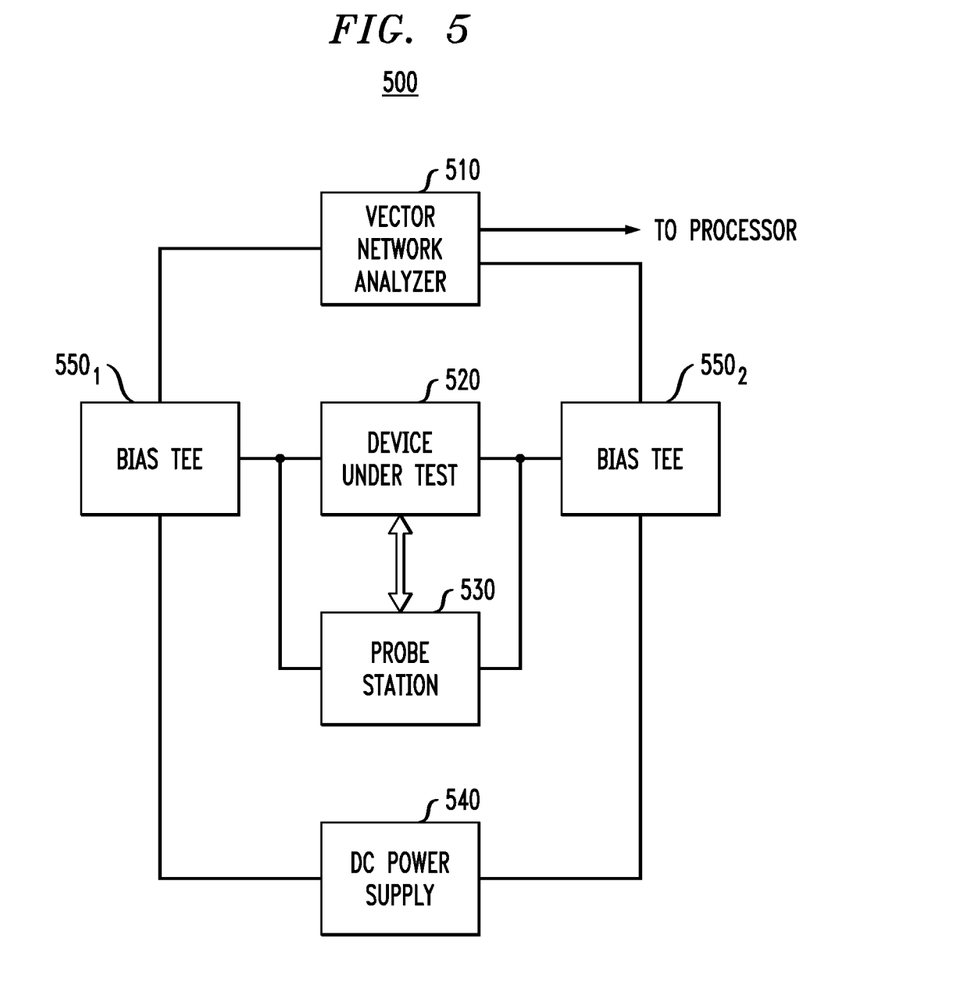
FIG. 5 shows a measurement system that can be used to measure radio-frequency characteristics of the electrical cell of FIG. 2 according to an embodiment of the disclosure.

FIG. 5 shows a measurement system 500 that can be used to obtain RF characteristics of an EC material used in cell 200 (FIG. 2) according to an embodiment of the disclosure. More specifically, measurement system 500 is configured to measure RF characteristics, such as the S-parameters, of a device under test (DUT) 520. DUT 520 may include cell 200 and/or one or more calibration structures or cells. DUT 520 is mounted in a conventional probe station 530 that may be configured to perform one or more of the following functions: (i) secure the DUT on a translation stage; (ii) controllably move the DUT in any of three dimensions; and (iii) apply RF and DC probes to the desired spots in the DUT. A DC power supply 540 is configured to apply a desired DC bias voltage to the electrodes (e.g., electrode layers 104 and 112, FIG. 1; or 220 and 222, FIG. 2) adjacent to the EC material that is being tested in DUT 520. Bias tees $550_1$ and $550_2$ are configured to superimpose the DC bias voltage generated by power supply 540 and a CW RF probe signal generated by a vector network analyzer (VNA) 510. VNA 510 is configured to measure the S-parameters of DUT 520 as a function of frequency of the RF probe signal and communicate the measurement results to an external processor (not explicitly shown in FIG. 5). The external processor is configured to process the measurement results received from VNA 510, e.g., using an appropriate processing method, to obtain the relevant RF characteristics of the EC material used in DUT 520. An example processing method that can be used for this purpose is described below in reference to FIG. 6.

Figure 6:
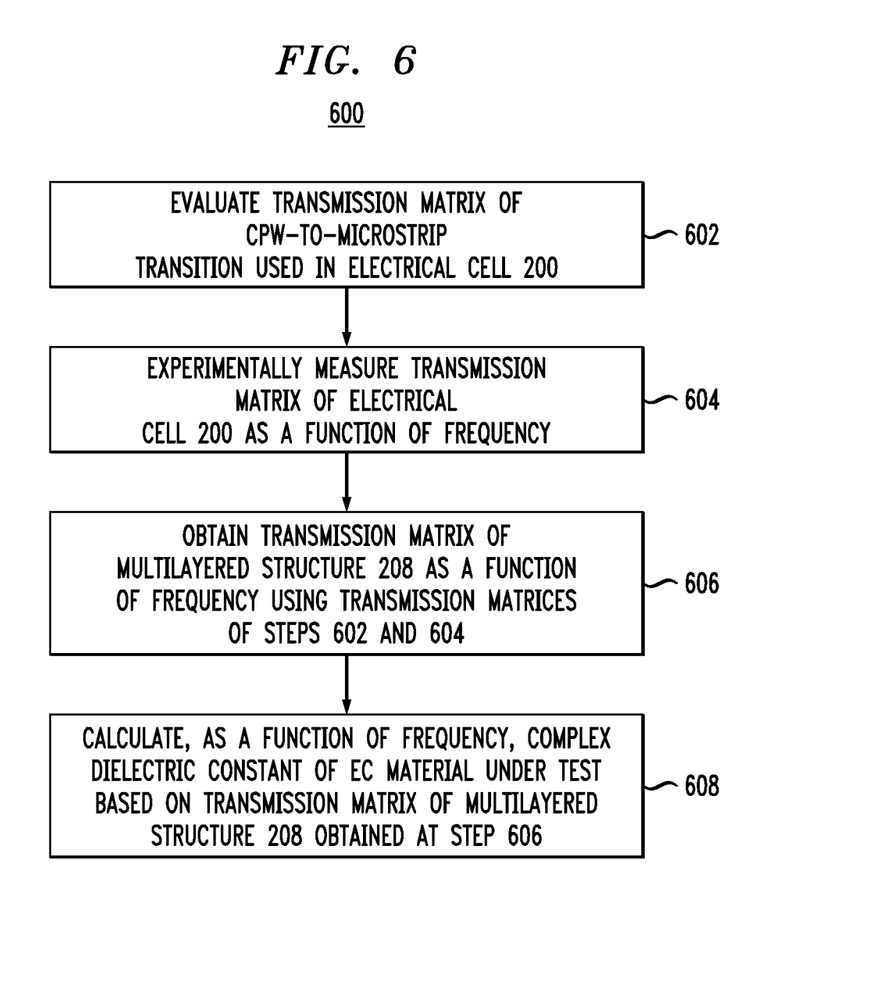
FIG. 6 shows a flowchart of a method that can be used to obtain RF characteristics of an EC material according to an embodiment of the disclosure.

FIG. 6 shows a flowchart of a method 600 that can be used to obtain RF characteristics of an EC material according to an embodiment of the disclosure. In an example embodiment, method 600 uses electrical cell 200 (FIG. 2) and measurement system 500 (FIG. 5), or equivalents thereof.

At step 602, the transmission matrix, $T_{trans}$, of a CPW-to-microstrip transition 230 is evaluated. This evaluation is performed because electrical cell 200 includes two instances of such a CPW-to-microstrip transition, e.g., $230_1$ and $230_2$ (see FIG. 2A).

For example, a reference cell having one or two CPW-to-microstrip transitions 230 can be manufactured and then configured as DUT 520 in measurement system 500 (FIG. 5) for the evaluation carried out at step 602. In one embodiment, the reference cell may be manufactured using a modified process flow of FIG. 4, in which the formation of multilayered structure 208 shown in FIG. 4B is omitted, and the deposition of dielectric layer 204 shown in FIG. 4C is modified in a manner that causes this dielectric layer to be contiguous, e.g., by extending and merging parts $204_1$ and $204_2$ in the area corresponding to multilayered structure 208.

One of ordinary skill in the art will also understand how to obtain the transmission matrix $T_{revtrans}$ of CPW-to-microstrip transition 230 based on the measurement results on the reference cell, wherein transmission matrices $T_{trans}$ and $T_{revtrans}$ are the transmission matrices of CPW-to-microstrip transition 230 in opposite signal-propagation directions. In one embodiment, the implementation of step 602 may benefit from the elements of the method of evaluating a CPW-to-microstrip transition disclosed in the above-cited article by Senad Bulja and Dariush Mirshekar-Syahkal, said method including, inter alia, a two-tier TL (through-line) method for extracting the S-parameters a CPW-to-microstrip transition having a split dielectric level and certain specific structures at the input and output.

At step 604, measurement system 500 (FIG. 5) is used to experimentally measure the transmission matrix, $T_{cell}$, of electrical cell 200 (FIG. 2) as a function of frequency.

At step 606, the measurement results obtained at step 604 are processed to obtain the transmission matrix, $T_{208}$, of multilayered structure 208 (FIG. 2) as a function of frequency. In an example embodiment, the processing of step 606 may be carried out using the following decomposition transmission matrix $T_{cell}$ into constituent components:

$$T_{cell} = T_{trans} T_{dis} T_{208} T_{revdis} T_{revtrans} \tag{3}$$

where $T_{dis}$ and $T_{revdis}$ are the transmission matrix of the discontinuities corresponding to junctions $206_1$ and $206_2$ (see FIGS. 2A, 2D, and 4C).

At step 608, the complex dielectric constant of the EC material under test is calculated, as a function of frequency, based on transmission matrix $T_{208}$ obtained at step 606.

In one embodiment, Eqs. (4)-(8) may be used in the calculations carried out at step 608. Transmission matrix $T_{208}$ is related to the complex propagation constant ($\gamma$) of multilayered structure 208 as follows:

$$T_{208} = \begin{bmatrix} \exp(-\gamma L) & 0 \\ 0 & \exp(\gamma L) \end{bmatrix} \tag{4}$$

where L is the length of multilayered structure 208 along microstrip line 220. Complex propagation constant ($\gamma$) is given by Eq. (5):

$$\gamma = (\alpha_1 + \alpha_2) + j\beta \tag{5}$$

where $\alpha_1$ is the attenuation due to the conductors (e.g., 220 and 222) adjacent to multilayered structure 208; $\alpha_2$ is the attenuation due to the EC material; and $\beta$ is the imaginary part of the propagation constant. The effective dielectric constant ($\in$) of multilayered structure 208 and the loss angle ($\delta$) are expressed by Eqs. (6)-(7):

$$\varepsilon = \left(\frac{\beta\lambda}{2\pi}\right)^2 \tag{6}$$

$$\tan(\delta) = \frac{2\alpha_2\beta}{\beta^2 - \alpha_2^2} \tag{7}$$

where $\lambda$ is the wavelength of the RF wave. Eq. (8) gives a good estimate of $\alpha_1$ as follows:

$$\alpha_1 = \frac{\sqrt{\varepsilon}\, R_s}{\eta_0 h} \tag{8}$$

where $R_s$ is the surface resistivity of the conductors; $\eta_0$ is the intrinsic impedance of free space, and h is the thickness of multilayered structure 208.

Once effective dielectric constant $\in$ and loss angle $\delta$ are calculated, e.g., using Eqs. (4)-(8), the complex dielectric constant of the EC material under test can be calculated in a relatively straightforward manner, provided that the dielectric properties of the other materials used in multilayered structure 208 are known in the frequency range of interest.

For example, various commercially available software packages, such as CST Microwave Studio and ADS Momentum, can be used for this purpose.

According to an example embodiment disclosed above in reference to FIGS. 1-6, provided is an apparatus comprising: a first coplanar waveguide (e.g., $210_1$, FIG. 2) that comprises a first center-conductor strip (e.g., $212_1$, FIG. 2), a first side-conductor strip (e.g., $214_1$, FIG. 2), and a second side-conductor strip (e.g., $216_1$, FIG. 2) formed on a surface of a substrate (e.g., 202, FIGS. 2 and 4); a multilayered structure (e.g., 100, FIG. 1; 208/222, FIG. 2) that comprises a base layer (e.g., 222, FIG. 2) formed on the surface of the substrate and connected to the first and second side-conductor strips, and a layer (e.g., 240, FIG. 2) of a first electrochromic material (e.g., $WO_3$, FIG. 3) formed on the base layer; a microstrip line (220, FIG. 2) formed on a surface of the multilayered structure at a first offset distance from the base layer; and a first transition structure (e.g., $230_1$, FIG. 2) configured to electrically connect the first center-conductor strip and the microstrip line.

In some embodiments of the above apparatus, the first center-conductor strip, the first side-conductor strip, and the second side-conductor strip are all coplanar with one another; the first side-conductor strip and the second side-conductor strip are electrically connected to one another via the base layer and located at opposite sides of the first center-conductor strip; and the first center-conductor strip is electrically insulated from the first side-conductor strip, the second side-conductor strip, and the base layer.

In some embodiments of any of the above apparatus, the apparatus further comprises: a second coplanar waveguide (e.g., $210_2$, FIG. 2) that comprises a second center-conductor strip (e.g., $212_2$, FIG. 2), a third side-conductor strip (e.g., $214_2$, FIG. 2), and a fourth side-conductor strip (e.g., $216_2$, FIG. 2) formed on the surface of a substrate (e.g., 202, FIGS. 2 and 4); and a second transition structure (e.g., $230_2$, FIG. 2) configured to electrically connect the second center-conductor strip and the microstrip line.

In some embodiments of any of the above apparatus, the base layer is electrically connected to the third and fourth side-conductor strips.

In some embodiments of any of the above apparatus, the first center-conductor strip, the second center-conductor strip, the first side-conductor strip, the second side-conductor strip, the third side-conductor strip, the fourth side-conductor strip, and the base layer are all coplanar with one another.

In some embodiments of any of the above apparatus, the first center-conductor strip, the second center-conductor strip, the first side-conductor strip, the second side-conductor strip, the third side-conductor strip, the fourth side-conductor strip, and the base layer are formed from a same electrically conducting layer of material.

In some embodiments of any of the above apparatus, the second center-conductor strip, the third side-conductor strip, and the fourth side-conductor strip are all coplanar with one another; the third side-conductor strip and the fourth side-conductor strip are electrically connected to one another via the base layer and located at opposite sides of the second center-conductor strip; and the second center-conductor strip is electrically insulated from the third side-conductor strip, the fourth side-conductor strip, and the base layer.

In some embodiments of any of the above apparatus, the apparatus further comprises a first dielectric layer (e.g., $204_1$, FIG. 4) formed on the substrate over the first coplanar waveguide and the base layer, wherein: an edge of the first dielectric layer is adjacently connected (at junction $206_1$, FIG. 2) to a corresponding edge of the multilayered structure; and a portion of the microstrip line is formed on a surface of the first dielectric layer located at the first offset distance from the base layer (e.g., as shown in FIG. 2D).

In some embodiments of any of the above apparatus, the first transition structure comprises an electrically conducting via (e.g., $218_1$, FIG. 4) formed in an opening in the first dielectric layer and connected between an end of the microstrip line and an end of the first center-conductor strip.

In some embodiments of any of the above apparatus, the apparatus further comprises a second dielectric layer (e.g., $204_2$, FIG. 4) formed on the substrate over the base layer and laterally separated from the first dielectric layer, wherein: an edge of the second dielectric layer is adjacently connected (at junction $206_2$, FIG. 2) to a corresponding edge of the multilayered structure; and a portion of the microstrip line is formed on a surface of the second dielectric layer located at the first offset distance from the base layer (e.g., as shown in FIG. 4E).

In some embodiments of any of the above apparatus, the multilayered structure further comprises a layer (e.g., 238, FIG. 2E) of a solid-electrolyte material (e.g., $LiNbO_3$, FIG. 3) formed over the layer of the first electrochromic material at a second offset distance from the base layer smaller than the first offset distance.

In some embodiments of any of the above apparatus, the multilayered structure further comprises an ion-storage layer (e.g., 236, FIG. 2E) configured to exchange ions with the layer of the solid-electrolyte material.

In some embodiments of any of the above apparatus, the ion-storage layer comprises a second electrochromic material different from the first electrochromic material.

In some embodiments of any of the above apparatus, the ion-storage layer comprises a polymer.

In some embodiments of any of the above apparatus, the first electrochromic material comprises an inorganic oxide.

In some embodiments of any of the above apparatus, the surface of the multilayered structure on which the microstrip line is formed is a surface of the ion-storage layer.

In some embodiments of any of the above apparatus, the multilayered structure has a thickness that is smaller (e.g., by a factor of at least 10) than a transverse width of the microstrip line.

In some embodiments of any of the above apparatus, the first electrochromic material comprises a polymer.

In some embodiments of any of the above apparatus, the first electrochromic material is configured to undergo an electrochromic change (e.g., in accordance with redox reaction (1)) when a dc-voltage differential is applied between the first center-conductor strip and the first side-conductor strip.

According to another example embodiment disclosed above in reference to FIGS. 1-6, provided is a method of measuring dielectric properties of an electrochromic material, the method comprising the steps of: (A) measuring (e.g., 604, FIG. 6) S-parameters of an electrical cell, wherein the electrical cell comprises: a first coplanar waveguide (e.g., $210_1$, FIG. 2) that comprises a first center-conductor strip (e.g., $212_1$, FIG. 2), a first side-conductor strip (e.g., $214_1$, FIG. 2), and a second side-conductor strip (e.g., $216_1$, FIG. 2) formed on a surface of a substrate (e.g., 202, FIGS. 2 and 4); a multilayered structure (e.g., 100, FIG. 1; 208/222, FIG. 2) that comprises a base layer (e.g., 222, FIG. 2) formed on the surface of the substrate and connected to the first and second side-conductor strips, and a layer (e.g., 240, FIG. 2) of the electrochromic material (e.g., $WO_3$, FIG. 3) formed on the base layer; a microstrip line (220, FIG. 2)

formed on a surface of the multilayered structure and located at a first offset distance from the base layer; and a first transition structure (e.g., $230_1$, FIG. 2) configured to electrically connect the first center-conductor strip and the microstrip line; and (B) calculating (e.g., 608, FIG. 6) a complex dielectric constant of the electrochromic material based on the measured S-parameters of the electrical cell.

In some embodiments of the above method, the step of measuring comprises measuring (e.g., 602, FIG. 6) S-parameters of a reference cell that includes a second transition structure nominally equivalent to the first transition structure.

In some embodiments of any of the above methods, the step of calculating comprises obtaining (e.g., 606, FIG. 6) S-parameters of the multilayered structure based on the measured S-parameters of the electrical cell and the measured S-parameters of the reference cell.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three dimensional structure as shown in the figures. Such "height" would be vertical where the electrodes are horizontal but would be horizontal where the electrodes are vertical, and so on. Similarly, while all figures show the different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

What is claimed is:

1. An apparatus comprising:
   a first coplanar waveguide that comprises a first center-conductor strip, a first side-conductor strip, and a second side-conductor strip formed on a surface of a substrate;
   a multilayered structure that comprises a base layer formed on the surface of the substrate and connected to the first and second side-conductor strips, and a layer of a first electrochromic material formed on the base layer;
   a microstrip line formed on a surface of the multilayered structure at a first offset distance from the base layer; and
   a first transition structure configured to electrically connect the first center-conductor strip and the microstrip line; and
   wherein the multilayered structure further comprises a layer of a solid-electrolyte material formed over the layer of the first electrochromic material at a second offset distance from the base layer smaller than the first offset distance.

2. The apparatus of claim 1, wherein:
   the first center-conductor strip, the first side-conductor strip, and the second side-conductor strip are all coplanar with one another;
   the first side-conductor strip and the second side-conductor strip are electrically connected to one another via the base layer and located at opposite sides of the first center-conductor strip; and
   the first center-conductor strip is electrically insulated from the first side-conductor strip, the second side-conductor strip, and the base layer.

3. The apparatus of claim 1, further comprising:
a second coplanar waveguide that comprises a second center-conductor strip, a third side-conductor strip, and a fourth side-conductor strip formed on the surface of a substrate; and
a second transition structure configured to electrically connect the second center-conductor strip and the microstrip line.

4. The apparatus of claim 3, wherein the base layer is electrically connected to the third and fourth side-conductor strips.

5. The apparatus of claim 3, wherein the first center-conductor strip, the second center-conductor strip, the first side-conductor strip, the second side-conductor strip, the third side-conductor strip, the fourth side-conductor strip, and the base layer are all coplanar with one another.

6. The apparatus of claim 5, wherein the first center-conductor strip, the second center-conductor strip, the first side-conductor strip, the second side-conductor strip, the third side-conductor strip, the fourth side-conductor strip, and the base layer are formed from a same electrically conducting layer of material.

7. The apparatus of claim 3, wherein:
the second center-conductor strip, the third side-conductor strip, and the fourth side-conductor strip are all coplanar with one another;
the third side-conductor strip and the fourth side-conductor strip are electrically connected to one another via the base layer and located at opposite sides of the second center-conductor strip; and
the second center-conductor strip is electrically insulated from the third side-conductor strip, the fourth side-conductor strip, and the base layer.

8. The apparatus of claim 1, further comprising a first dielectric layer formed on the substrate over the first coplanar waveguide and the base layer, wherein:
an edge of the first dielectric layer is adjacently connected to a corresponding edge of the multilayered structure; and
a portion of the microstrip line is formed on a surface of the first dielectric layer located at the first offset distance from the base layer.

9. The apparatus of claim 8, wherein the first transition structure comprises an electrically conducting via formed in an opening in the first dielectric layer and connected between an end of the microstrip line and an end of the first center-conductor strip.

10. The apparatus of claim 8, further comprising a second dielectric layer formed on the substrate over the base layer and laterally separated from the first dielectric layer, wherein:
an edge of the second dielectric layer is adjacently connected to a corresponding edge of the multilayered structure; and
a portion of the microstrip line is formed on a surface of the second dielectric layer located at the first offset distance from the base layer.

11. The apparatus of claim 1, wherein the multilayered structure further comprises an ion-storage layer configured to exchange ions with the layer of the solid-electrolyte material.

12. The apparatus of claim 11, wherein the ion-storage layer comprises a second electrochromic material different from the first electrochromic material.

13. The apparatus of claim 12,
wherein the ion-storage layer comprises a polymer; and
wherein the first electrochromic material comprises an inorganic oxide.

14. The apparatus of claim 11, wherein the surface of the multilayered structure on which the microstrip line is formed is a surface of the ion-storage layer.

15. The apparatus of claim 1, wherein the multilayered structure has a thickness that is smaller than a transverse width of the micro strip line.

16. The apparatus of claim 1, wherein the first electrochromic material comprises a polymer.

17. The apparatus of claim 1, wherein the first electrochromic material is configured to undergo an electrochromic change when a dc-voltage differential is applied between the first center-conductor strip and the first side-conductor strip.

18. A method of measuring dielectric properties of an electrochromic material, the method comprising:
measuring S-parameters of an electrical cell, wherein the electrical cell comprises:
a first coplanar waveguide that comprises a first center-conductor strip, a first side-conductor strip, and a second side-conductor strip formed on a surface of a substrate;
a multilayered structure that comprises a base layer formed on the surface of the substrate and connected to the first and second side-conductor strips, and a layer of the electrochromic material formed on the base layer;
a microstrip line formed on a surface of the multilayered structure and located at a first offset distance from the base layer; and
a first transition structure configured to electrically connect the first center-conductor strip and the microstrip line; and
calculating a complex dielectric constant of the electrochromic material based on the measured S-parameters of the electrical cell; and
wherein the multilayered structure further comprises a layer of a solid-electrolyte material formed over the layer of the first electrochromic material at a second offset distance from the base layer smaller than the first offset distance.

19. The method of claim 18,
wherein the step of measuring comprises measuring S-parameters of a reference cell that includes a second transition structure nominally equivalent to the first transition structure; and
wherein the step of calculating comprises obtaining S-parameters of the multilayered structure based on the measured S-parameters of the electrical cell and the measured S-parameters of the reference cell.

* * * * *